United States Patent
Ono et al.

(10) Patent No.: US 7,405,394 B2
(45) Date of Patent: Jul. 29, 2008

(54) GAS CLUSTER-ION IRRADIATION APPARATUS

(75) Inventors: Shigeru Ono, Yokohama (JP); Shinji Sasaki, Yokohama (JP); Kenji Furusawa, Yokohama (JP); Jiro Matsuo, Kyoto (JP); Toshio Seki, Kyoto (JP)

(73) Assignee: Hitachi, Ltd., Tokyo (JP)

( * ) Notice: Subject to any disclaimer, the term of this patent is extended or adjusted under 35 U.S.C. 154(b) by 400 days.

(21) Appl. No.: 11/173,023

(22) Filed: Jul. 5, 2005

(65) Prior Publication Data
US 2006/0043317 A1 Mar. 2, 2006

(30) Foreign Application Priority Data
Aug. 24, 2004 (JP) ............................ 2004-243092

(51) Int. Cl.
*B01D 59/44* (2006.01)
(52) U.S. Cl. .................................. 250/287; 250/282
(58) Field of Classification Search ............. 250/493.2, 250/492.3
See application file for complete search history.

(56) References Cited

U.S. PATENT DOCUMENTS

| | | | | |
|---|---|---|---|---|
| 4,311,669 A | * | 1/1982 | Spangler | 422/98 |
| 4,378,499 A | * | 3/1983 | Spangler et al. | 250/287 |
| 4,551,624 A | * | 11/1985 | Spangler et al. | 250/287 |
| 5,234,838 A | * | 8/1993 | Bacon, Jr. | 436/173 |
| 5,808,962 A | * | 9/1998 | Steinberg et al. | 367/7 |
| 6,331,227 B1 | * | 12/2001 | Dykstra et al. | 156/345.29 |
| 2002/0036261 A1 | * | 3/2002 | Dykstra | 250/287 |
| 2006/0087244 A1 | * | 4/2006 | Regan | 315/111.21 |
| 2006/0102854 A1 | * | 5/2006 | Neogi et al. | 250/492.1 |

FOREIGN PATENT DOCUMENTS

| | | |
|---|---|---|
| JP | 4-354865 | 12/1992 |
| JP | 11-250854 | 9/1999 |
| JP | 2002-15694 | 1/2002 |

OTHER PUBLICATIONS

I. Yamada, et al., Material Science and Engineering, R34, (2001), pp. 231-295.
T. Aoki, et al., Nuclear Instruments and Methods in Physics Research B 202 (2003) pp. 278-282.

* cited by examiner

*Primary Examiner*—Nikita Wells
*Assistant Examiner*—Johnnie L Smith
(74) *Attorney, Agent, or Firm*—Antonelli, Terry, Stout & Kraus, LLP.

(57) ABSTRACT

In a cluster ion beam irradiation apparatus including an apparatus for measuring size and energy distribution of gas cluster ions by using the time of flight (TOF) mass spectrometry, a unit for applying a retarding voltage is disposed in a stage preceding a TOF measuring instrument including a drift tube and a current measuring instrument. By measuring the size and energy distribution of the gas cluster ions and adjusting ionization conditions, cluster ions having predetermined energy and size are supplied to a work surface. In addition, a product of a pressure in an ion transportation device and an ion transportation length is controlled so as to satisfy the relation $P \times L \leq 30/N^{2/3}/E^{1/2}$ Pa·m, where N is the size of gas cluster ions used for irradiation, and E is kinetic energy (eV) of the gas cluster ions.

4 Claims, 10 Drawing Sheets

GAS CLUSTER-ION IRRADIATION APPARATUS

INCORPORATION BY REFERENCE

The present application claims priority from Japanese application JP2004-243092 filed on Aug. 24, 2004, the content of which is hereby incorporated by reference into this application.

BACKGROUND OF THE INVENTION

The present invention relates to a cluster ion beam irradiation apparatus and a method for manufacturing magnetic recording head element using the apparatus.

As the wiring in semiconductor devices becomes finer and the areal density in hard disk drives increases, attention is being paid to the gas cluster ion beam as the method for manufacturing semiconductor devices and magnetic recording heads. The gas clusters are several hundreds to several thousands aggregates of gaseous atoms or molecules (hereafter referred to as monomer). A method for generating the gas clusters is described in JP-A-4-354865. The ionized clusters are accelerated by an acceleration voltage, and a work is irradiated with the accelerated ionized clusters. If the cluster collides with the work, the incident energy is distributed to individual atoms forming the cluster. As compared with the monomer ion beam, therefore, irradiation at high density and low energy becomes possible.

It is described in I. Yamada, et al., Materials Science and Engineering, R 34, (2001), pp. 231-295 that the cluster ion beam generated as described above has a feature which is different from the conventional monomer ion beam. For example, if the work is irradiated perpendicularly by the conventional monomer ion beam, surface roughness occurs. On the other hand, if the work surface is irradiated perpendicularly by the gas cluster ion beam, it is possible to make an uneven surface even, owing to the lateral sputtering effect.

If the gas cluster ion beam is used, it is easy to reduce the average surface roughness to 1 nm or less. Furthermore, since the gas cluster ion has a large mass, irradiation at lower speed than the monomer ion is possible even if the same acceleration voltage is given. As compared with the process using the monomer ions, therefore, the milling damage depth can be decreased. Furthermore, due to a nonlinear effect caused by multiple-collision of atoms included in a cluster, a high sputtering rate is obtained.

It is disclosed in T. Aoki, et al., Nuclear Instruments and Methods in Physics Research B 202 (2003) pp. 278-282 that the irradiation effect of the gas cluster ions largely depends on the cluster size. In other words, the depth of the milling damage layer largely depends not only on the energy of the gas cluster ions but also on the size thereof. Here, the size of cluster ions means the number of monomers included in a cluster.

As for the method for measuring the size of gas cluster ions, there are methods using a quadrupole mass spectrometer (QMS) and methods using the time of flight (TOF) mass spectrometry. They are disclosed in I. Yamada, et al., Materials Science and Engineering, R 34, (2001), pp. 231-295. Ions having such a mass that the ions can pass through between the rods are determined according to the condition of the high frequency voltage applied to four rods. The methods using the QMS are methods for conducting the mass spectrometry by using this fact.

On the other hand, the TOF mass spectrometry is a method for conducting the mass spectrometry by measuring the time taken for ions to pass through a drift tube, because ions having definite energy have different velocities depending on the mass. As a method for conducting ion mass spectrometry besides the QMS mass spectrometry and the TOF mass spectrometry, a magnetic sector type mass spectrometer using the fact that the Larmar radius differs depending on the momentum of the ion when the ion conducts a Larmar motion is known. In addition, a method by which ion energy and mass can be analyzed simultaneously by combining an electrostatic energy analyzer with the QMS is disclosed in JP-A-11-250854 and another method by which ion energy and mass can be analyzed simultaneously by combining the magnetic sector type mass spectrometer and the TOF method is disclosed in JP-A-2002-15694.

SUMMARY OF THE INVENTION

The effect obtained by irradiation with the gas cluster ion beam largely depends on the size and energy of gas cluster ions. The size distribution of gas cluster ions can be controlled to some degree by the ionization condition. The energy is controlled by applying a definite acceleration voltage to an ion extraction electrode. In addition, by keeping the gas cluster ion beam current at a definite value, the etch rate becomes definite and the process design becomes possible.

In the case of a gas cluster ion beam controlled in energy by a definite acceleration voltage, it is necessary to grasp the size of gas cluster ions and exercise control so as to make the size definite. The size analysis becomes possible by conducting mass spectrometry on a gas cluster ion beam aligned in energy. Since the mass number which can be analyzed by a commercially available QMS is up to approximately several thousands, the cluster size can be measured in the range of approximately several tens to several hundreds.

On the other hand, gas cluster ions included in the gas cluster ion beam are widely distributed up to several ten thousands. Therefore, it is impossible to measure the cluster size distribution by using the QMS. If the magnetic sector type mass spectrometer is used, size distribution can be measured in principle. Since a strong magnetic field is necessary and the spectrometer becomes huge, however, it is not practical.

Unlike the QMS mass spectrometry, in the TOF mass spectrometry, the time taken for an ion having definite energy to pass through the inside a drift tube having a definite length is measured, and ion mass (cluster size) is found from the time. Measurement can be conducted irrespective of the cluster size.

Attention should be paid to residual gas molecules and collision during transportation of gas cluster ions from the ion source to the work. In the case of the gas cluster ions, the mean free path is shorter as compared with monomer ions because the collision cross section is larger. For example, the collision cross section of a cluster having a size of 1,000 is 100 times as large as that of a monomer ion. At $1\times10^{-4}$ Torr ($1.3\times10^{-2}$ Pa), therefore, the mean free path of gas cluster ions having the size of 1,000 is approximately several mm.

On the other hand, the transportation space of gas cluster ions should be at least several tens cm in order to remove monomer ions generated concurrently with gas cluster ions, although the required transportation path depends on the acceleration voltage and the beam diameter as well. In other words, when the pressure in the transportation space of gas cluster ions is $1\times10^{-4}$ Torr, the gas cluster ions having the size of 1,000 collides with residual gas molecules approximately several tens to 100 times, and then the work is irradiated with them.

Collision of the gas cluster ions with the residual gas molecules is substantially equivalent to sputtering of the gas cluster ions with the residual gas molecules. If a gas cluster ion collides with a residual gas molecule, therefore, a part of atoms and molecules included in the cluster is stripped off and consequently the size of the cluster is reduced.

Since the residual gas molecule is far smaller in momentum than the gas cluster ion, the momentum change of the gas cluster ion is small. Therefore, the gas cluster ion reduced in size by collision continues the translation at the original velocity. In other words, the energy of the gas cluster ion is reduced by an amount corresponding to the reduction in size. Even if the number of atoms lost by a single collision is approximately 10, a great energy loss is caused depending upon the number of times of collision.

Collision with monomer ions included in the gas cluster ion beam also poses a problem. If a monomer ion collides with a gas cluster ion, atoms included in the gas cluster ion are turned out. Monomer ions are generated simultaneously when gas clusters are ionized. If the monomer ions and the gas cluster ions are accelerated at the same acceleration voltage, the monomer ions become very large in relative velocity with respect to the gas cluster ions because the monomer ions are far smaller in mass. If a monomer ion collides with a gas cluster ion, therefore, the number of atoms turned out by a single collision is larger than that in collision with a residual gas molecule and the lost energy also becomes large.

Also in the case of collision with a fast neutral atom generated by charge transfer collision between the monomer ion and an atom, a molecule or a cluster having no charge, lost energy is large in the same way as the collision with the monomer ion.

In the actual gas cluster ion beam, therefore, gas cluster ions that have lost energy as described above and have become small in size as well are included in addition to the cluster size distribution obtained at the time of generation of the beam. For conducting the process design, therefore, it is necessary to measure not only the size distribution of gas cluster ions but also energy distribution thereof simultaneously, and conduct adjustment and maintenance so as to obtain a gas cluster ion beam suitable for milling.

In general, it becomes possible to measure the mass and energy distribution of ions simultaneously by combining a mass spectrometer with an energy analyzer. Since the QMS or the magnetic sector type mass spectrometer is used in the methods used in the disclosed techniques, however, it is difficult to measure the size and energy distribution of cluster ions simultaneously in these methods. Furthermore, in the conventional TOF mass spectrometry, the time taken for an ion having definite energy to pass through a drift tube is measured and the cluster size is found. Therefore, the conventional TOF mass spectrometry cannot be applied to ion beams having various sizes and energies.

As described above, low-energy gas cluster ions having small sizes generated by collision are lower in milling capability than the original gas cluster ions. In the case where the proportion of such ions in the beam varies according to the apparatus state, desired milling cannot be conducted, resulting in a lowered yield. Therefore, it is indispensable in constructing a stable gas cluster ion beam milling process to measure and manage the size distribution and quantities of large clusters having milling capability.

In order to solve the problems, the present invention provides a method for providing a retarding voltage applying unit in front of a current inflow side of a cluster size measurement apparatus, which includes a drift tube, a current measuring instrument disposed at an outflow end of the drift tube, and a unit disposed at an inflow end of the drift tube to make a pulsed current flow into the drift tube, for excluding monomer ions irradiating the work surface at low energy and small-size gas cluster ions, and for conducting TOF measurement.

Specifically, a drift tube for letting an ion beam fly, a current measuring instrument (unit) for measuring an ion beam current via a Faraday cup disposed on an ion beam outflow end side of the drift tube, a voltage applying unit for applying a retarding voltage to the ion beam, the voltage applying unit being disposed on an ion beam inflow end side of the drift tube, and a pulse conversion unit for shaping the ion beam passed through the voltage applying unit into a pulse beam are disposed.

And the time over which the ion beam can pass through the pulse conversion unit is set equal to one tenth or less of the time taken for ions to pass through the drift tube.

On the other hand, the voltage applying unit includes ground electrodes each having an orifice for passing through the ion beam, and the orifice is set equal to 1 cm or less in diameter. Furthermore, the voltage applying unit includes ground electrodes and a retarding grid interposed between the ground electrodes, and the voltage applying unit is adapted to be capable of applying a retarding voltage.

Furthermore, in accordance with the present invention, a gas cluster ion irradiation apparatus includes a drift tube for letting an ion beam fly, a current measuring instrument for measuring an ion beam current, the current measuring instrument being disposed on an ion beam outflow end side of the drift tube, a voltage applying unit for applying a retarding voltage to the ion beam, the voltage applying unit being disposed on an ion beam inflow end side of the drift tube, and a unit for calculating size distribution of gas cluster ions passed through the drift tube on the basis of the ion beam current measured by applying a retarding voltage controlled so as to fall in a voltage range in which the ion beam current gently decreases as the retarding voltage is raised.

By doing so, it is possible to find the size distribution of clusters with monomer ions by which the work is irradiated at low energy and small-size gas cluster ions having no milling capability excluded.

In addition, a gas cluster ion irradiation apparatus includes a unit for calculating size and energy distribution of gas cluster ions passed through the drift tube by sweeping in a voltage range equal to or lower than an acceleration voltage of the ion beam from a state in which the retarding voltage is not applied and obtaining a difference of the ion beam current measured by applying arbitrary different retarding voltages.

Furthermore, the above-described optimally controlled cluster ion beam is applied to a manufacturing method of a magnetic recording head. In other words, the present invention provides a method for manufacturing a magnetic recording head having an air bearing surface on one surface of a slider. The method includes the steps of measuring gas cluster ion size distribution by using an ion beam current value obtained by letting an ion beam fly with an arbitrary retarding voltage applied thereto, in a drift tube, adjusting an ion beam irradiation condition, and then irradiating the air bearing surface with the gas cluster ion beam and milling the air bearing surface.

On the other hand, when conducting irradiation with gas cluster ions having energy E (eV) and an average size N from a gas cluster ion beam irradiation apparatus including a gas cluster generation unit, an ionization unit, an ion transportation device, and an ion irradiation unit, the same effect can also be obtained by controlling the product of the pressure (Pa) of the gas cluster ion transportation device and the gas cluster ion transportation length (m) so as to cause it to be equal to or less than $30/N^{2/3}/E^{1/2}$.

In other words, collision with monomer ions and residual gas molecules can be suppressed by exercising the above-described control. As a result, an apparatus capable of conducting irradiation with a gas cluster ion beam that does not include low-energy monomer ions and small-size cluster ions having no milling capability can be obtained.

In addition, the gas cluster ion beam controlled as described above is applied to a manufacturing method of a magnetic recording head. In other words, the present invention provides a method for manufacturing a magnetic recording head having an air bearing surface on one surface of a slider by conducting irradiation using gas cluster ions having energy E (eV) and an average size N and thereby conducting smoothing milling. The air bearing surface is irradiated by a gas cluster ion beam having a product of a pressure (Pa) in the ion transportation device and an ion transportation length (m) controlled to become $30/N^{2/3}/E^{1/2}$ or less. The air bearing surface is thus subject to milling.

The gas cluster ion beam by which the air bearing surface is irradiated has controlled energy distribution and size distribution. Unlike the conventional technique, therefore it is possible to prevent the content of gas cluster ion components having energy and size unsuitable for surface milling from varying. As a result, an extremely great effect that surface milling having extremely favorite roughness is conducted is brought about.

BRIEF DESCRIPTION OF THE DRAWINGS

These and other features, objects and advantages of the present invention will become more apparent from the following description when taken in conjunction with the accompanying drawings wherein.

DESCRIPTION OF THE EMBODIMENTS

Figure 1:
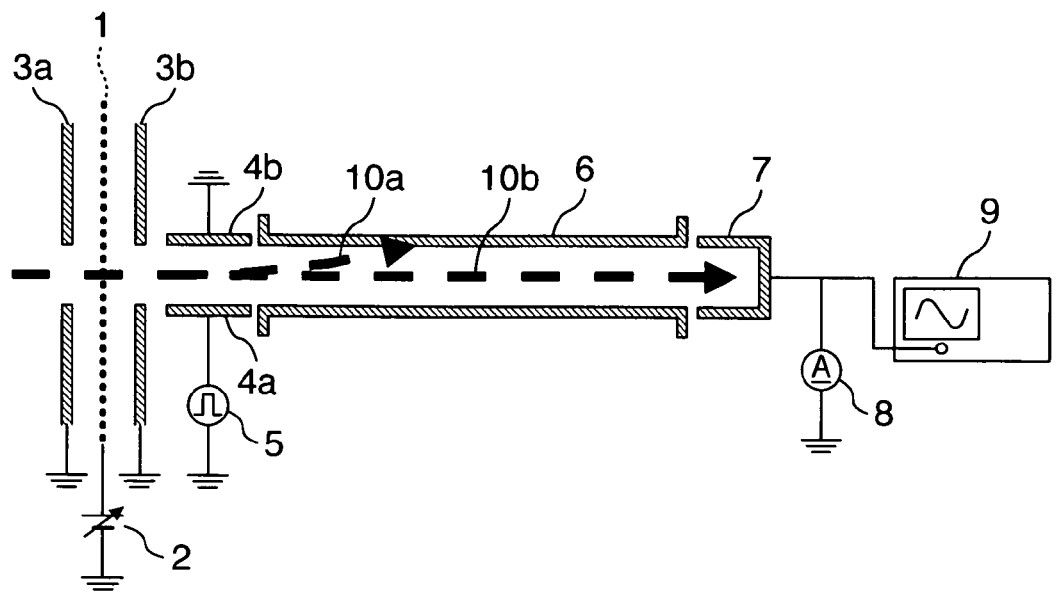
FIG. 1 is a schematic diagram showing an apparatus for measuring size and energy distribution of a cluster ion beam.

Hereafter, embodiments of the present invention will be described in detail with reference to the drawing.

First Embodiment

FIG. 1 shows a first embodiment of the present invention. A measurement apparatus according to the present invention includes a retarding grid 1 for applying a retarding voltage, ground electrodes 3a and 3b, deflection electrodes 4a and 4b for shaping an ion beam into a pulsed beam, a drift tube 6, and a current measuring instrument. An orifice is provided through each of the ground electrodes 3a and 3b. Since the orifices are provided to suppress an electric field that has oozed out, it is desirable to make the radius of the orifices equal to 1 cm or less.

In FIG. 1, a Faraday cup 7, a DC ammeter 8 for measuring a temporal average value of the current, and an oscilloscope 9 for measuring a change of the current with time are shown as an example of the current measuring instrument. However, other current measuring instruments are not excluded.

Neutral clusters generated in a generation chamber which is not illustrated are ionized in an ionization chamber, and then accelerated to definite energy $eV_a$. After acceleration, a beam transportation space ranging to the ground electrode 3a is typically kept in a non-electric field state. Monomer ions and gas cluster ions having smaller sizes generated by collision of gas cluster ions with monomer ions or ambient gas molecules and resultant dissociation move at the same velocity as that of the original gas cluster ions. Therefore, energy of these ions becomes smaller than the original energy.

If a retarding voltage $V_{ret}$ is applied to the retarding grid 1, therefore, low-energy monomer ions and small-size cluster ions included in gas cluster ion beam which is incident from the left cannot pass through the retarding grid 1.

Figure 2:
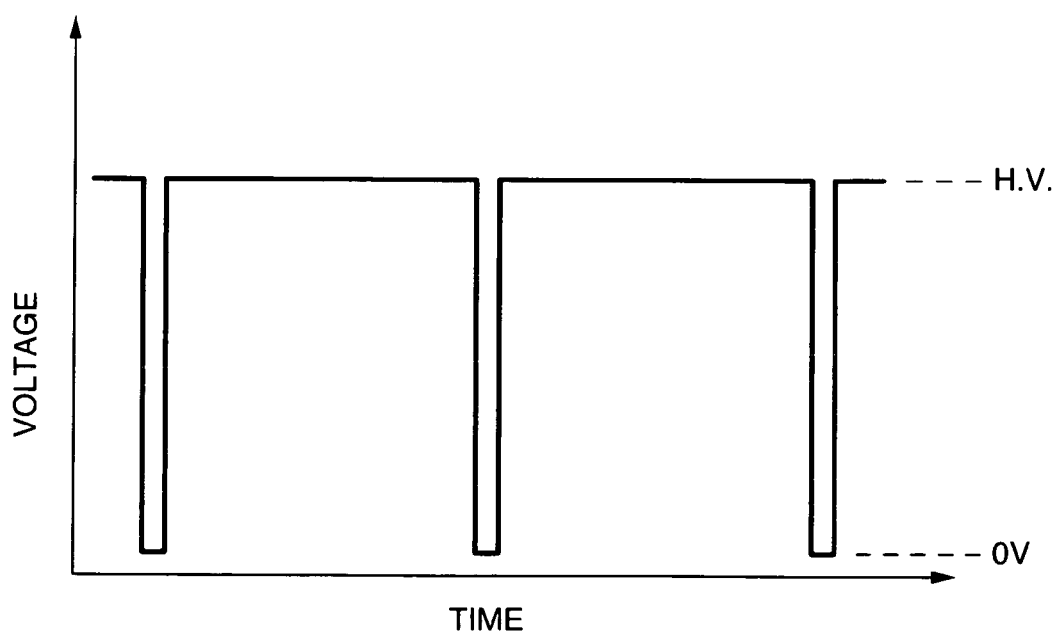
FIG. 2 is a diagram showing a change of a pulse voltage applied to a deflection electrode with time.

A pulse voltage as shown in FIG. 2 is applied to the deflection electrode 4a. When the deflection electrode 4a is at a high voltage, an ion beam which has passed through the retarding grid 1 cannot arrive at the Faraday cup 7 because the ion beam is deflected as represented by a trajectory 10a. When the voltage at the deflection electrode 4a is 0 V, the ion beam can pass through the drift tube 6 having a length L along a trajectory 10b and arrive at the Faraday cup 7. As for the voltage applied to the deflection electrode 4a, 10 kV or less which can be insulated relatively easily is desirable considering that the measurement apparatus is attached to a gas cluster ion beam irradiation apparatus.

In FIG. 2, a time width over which the voltage becomes 0 V is set equal to one tenth or less of time over which an ion having a size to be measured passes through the drift tube. If this time is long, it becomes impossible to accurately measure a small side of the cluster size distribution. The period of the pulse voltage is set to be longer than a time taken for all cluster ions to pass through the drift tube.

In order to make a pulsed beam current flow into the drift tube, a chopper having a slit provided in a part of a rotating disc may be used without using deflection electrodes. The slit width and the rotation period of the chopper at that time are set according to the way of thinking similar to that of the time width over which the pulse voltage is 0 V and the period of the pulse voltage.

Figure 3:
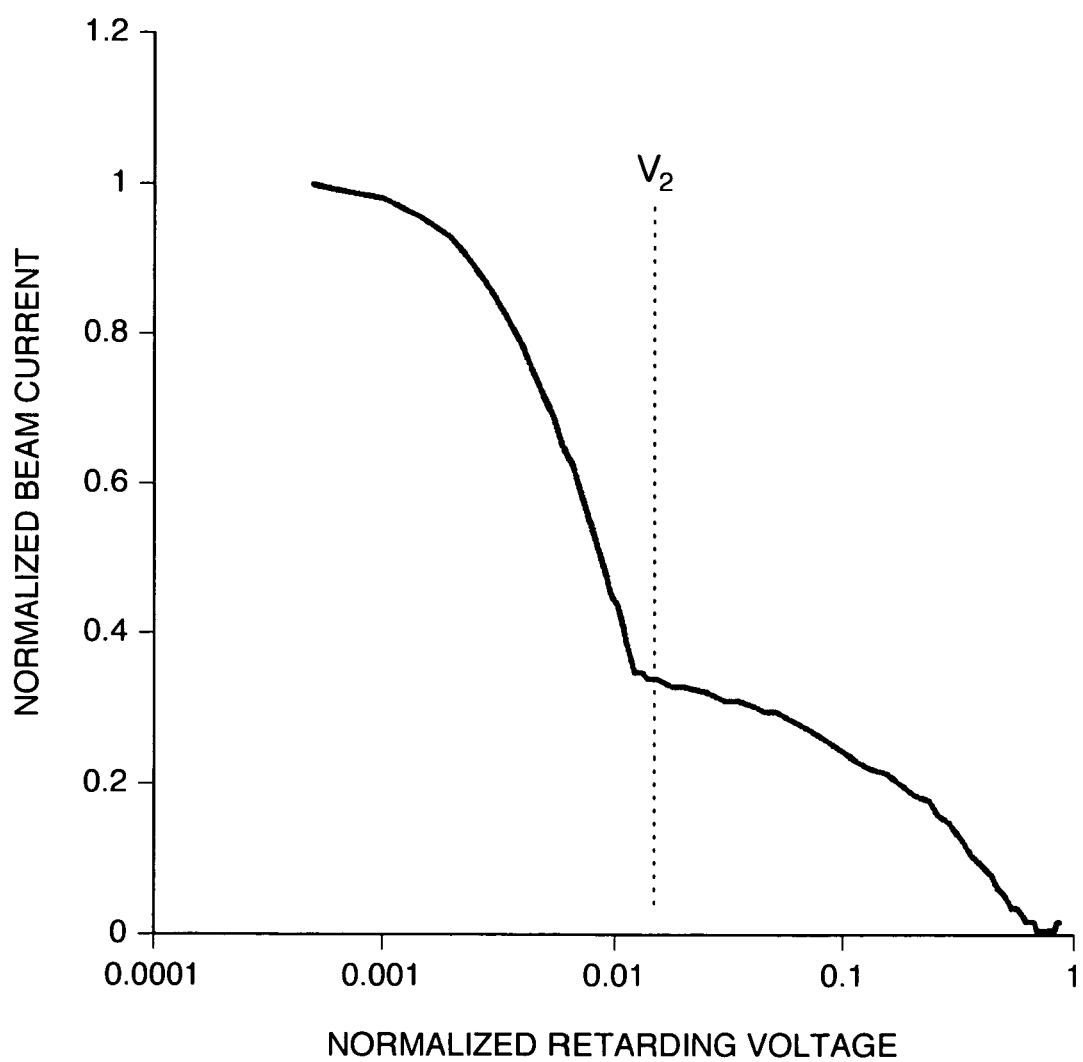
FIG. 3 is a diagram showing a relation between a retarding voltage and a beam current characteristic.

Hereafter, a method for determining the retarding voltage will be described. With the deflection electrode 4a kept at the ground potential, a beam current received by the Faraday cup 7 is measured by the DC ammeter 8. FIG. 3 shows the measured beam current as a function of the retarding voltage. The abscissa of FIG. 3 represents a normalized acceleration voltage, and the ordinate represents a beam current normalized by a beam current value obtained when the retarding voltage is not applied.

The gas cluster ions are accelerated to definite energy $eV_a$. If the retarding voltage is applied, however, the beam current abruptly decreases. Here, decreasing components are low-energy monomer ions and small-size gas cluster ions generated by collision with monomer ions and ambient gas molecules during the transportation of the gas cluster ion beam as described above. If the retarding voltage is further raised, the decrease of the beam current becomes gentle and finally decreases abruptly near $V_a$. (V=1 in FIG. 3).

Here, a voltage $V_2$ applied to the retarding grid 1 is set so as to fall in a region where the beam current gently decreases as the retarding voltage is raised. By thus setting the voltage $V_2$, it is possible to measure an effective cluster ion beam component having the milling capability which does not include low-energy monomer ions and small-size cluster ions.

Figure 4:
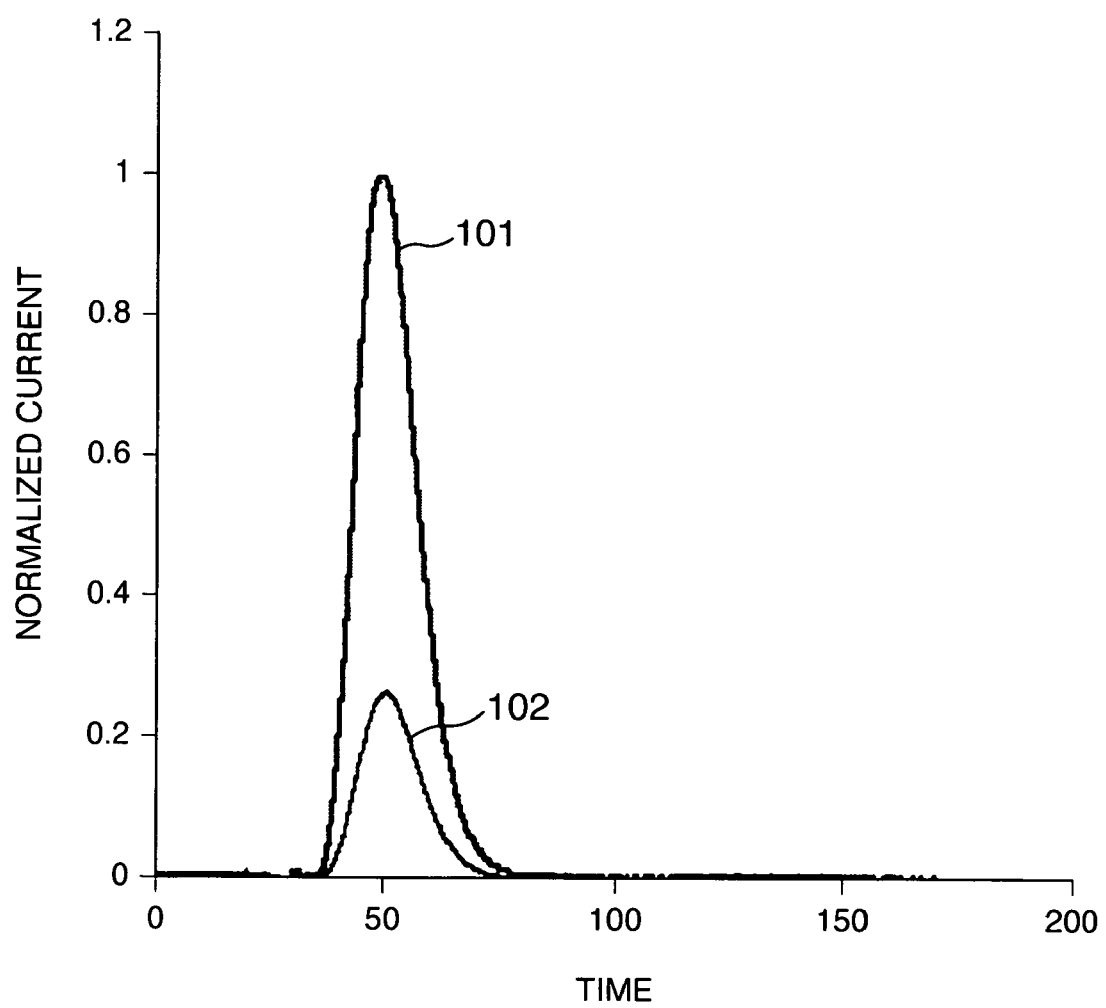
FIG. 4 is a diagram showing a beam current waveform passed through a drift tube and obtained by using a current measuring instrument (unit) when a pulse voltage is applied to a deflection electrode.

When the pulse voltage applied to the deflection electrode 4a is the ground potential, ions passed through between the deflection electrodes 4a and 4b arrive at the Faraday cup 7. A resultant current is measured by the oscilloscope 9. FIG. 4 shows the measured current. Numeral 101 denotes a current waveform measured by the oscilloscope 9 when the retarding voltage is not applied. Numeral 102 denotes a current waveform obtained when the retarding voltage is set equal to $V_2$. The current value is normalized by the maximum value of the waveform 101.

Figure 5:
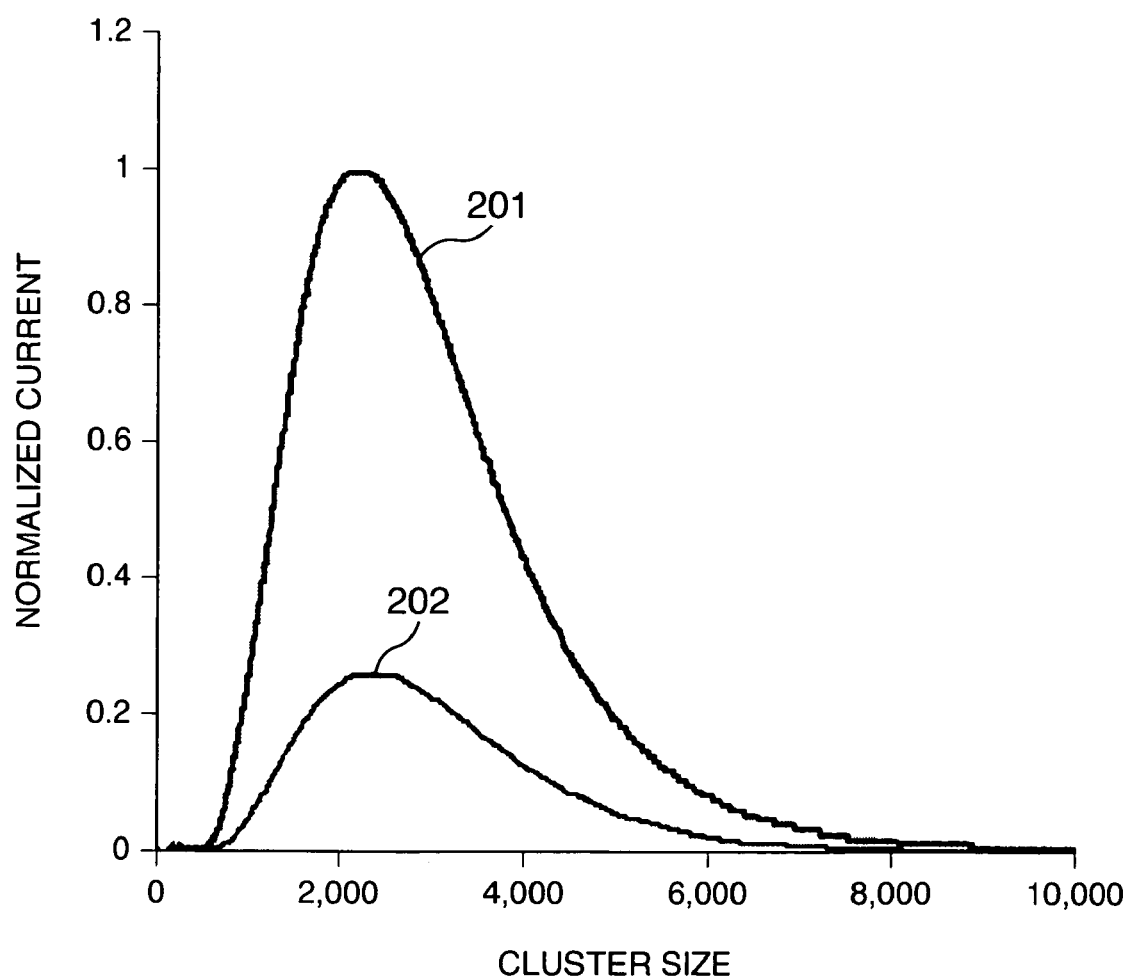
FIG. 5 is a diagram showing distribution of cluster size having milling capability, among cluster ions derived from the beam current waveform by using FIG. 4.

In addition, this result is applied to an equation $t=L(2 eV_a/m)$, and the abscissa is converted to mass m to obtain mass (cluster size) distribution as shown in FIG. 5. Numeral 201 denotes cluster size distribution obtained when the retarding voltage is not applied. Numeral 202 denotes cluster size distribution obtained when the retarding voltage is set equal to $V_2$. The current value is normalized by the maximum value of the waveform 201. The difference between the waveform 201 and 202 is a contribution of low-energy monomer ions and small-size gas cluster ions having no milling capability. In this measured example, a change is not found in the maximum value of the size distribution.

According to the present method, size distribution of gas cluster ions having milling capability can be obtained.

Second Embodiment

A second embodiment of the present invention will now be described with reference to FIG. 1. Neutral clusters generated in a generation chamber which is not illustrated are ionized in an ionization chamber, and then accelerated to definite energy $eV_a$. After acceleration, a beam transportation space ranging to the ground electrode 3a is typically kept in a non-electric field state. Monomer ions and small-size gas cluster ions generated by collision of gas cluster ions with monomer ions or ambient gas molecules and resultant dissociation move at the same velocity as that of the original gas cluster ions. Therefore, energy of these ions becomes smaller than the original energy.

If a retarding voltage $V_{ret}$ is applied to the retarding grid 1, therefore, low-energy monomer ions and small-size cluster ions included in gas cluster ion beam which is incident from the left cannot pass through the retarding grid 1.

A pulse voltage is applied to the deflection electrode 4a. When the deflection electrode 4a is at a high voltage, an ion beam which has passed through the retarding grid 1 cannot arrive at the Faraday cup 7 because the ion beam is deflected as represented by a trajectory 10a. When the voltage at the deflection electrode 4a is 0 V, however, the ion beam can pass through the drift tube 6 having a length L along a trajectory 10b and arrive at the Faraday cup 7.

Figure 6:
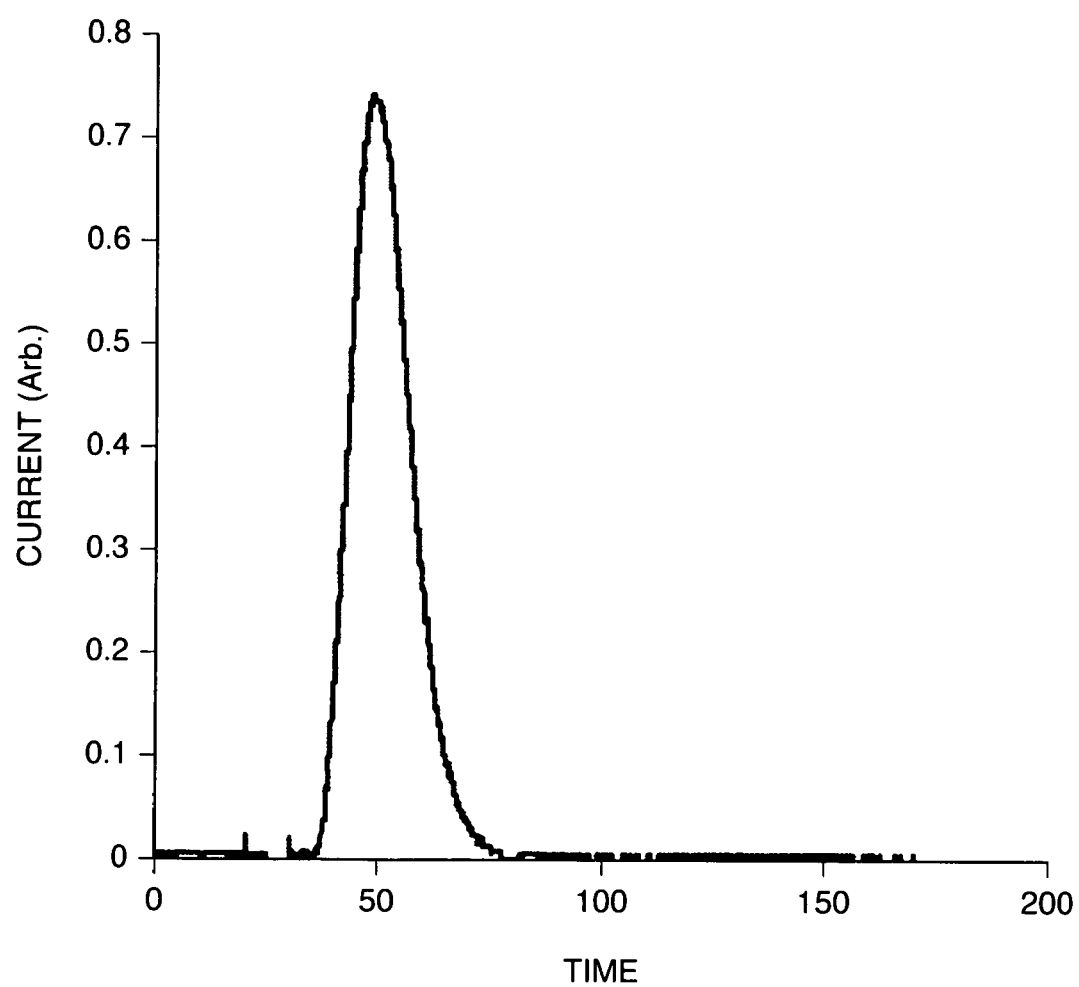
FIG. 6 is a diagram showing a beam current waveform passed through a drift tube and obtained by a current measuring instrument when a pulse voltage is applied to a deflection electrode.

A current $I_{v3}(t)$ arriving at the Faraday cup 7 when the retarding voltage is set to $V_3$ and a current $I_{v4}(t)$ arriving at the Faraday cup 7 when the retarding voltage is set to $V_4$ (where $V_4>V_3$) are measured by an oscilloscope 9. A difference $I_{v3}(t)-I_{v4}(t)$ between the currents is shown in FIG. 6. FIG. 6 shows how gas cluster ions having energy between $eV_3$ and $eV_4$ arrive with time differences because the gas cluster ions have different velocities according to the size (mass).

By converting the abscissa of FIG. 6 to the cluster size (mass) by using the conversion equation $t=L(2 eV/m)$, therefore, size distribution of gas cluster ions having energy between $eV_3$ and $eV_4$ can be obtained.

An error is caused because the time over which the deflection electrode 4a is at the ground potential is finite. If an error caused by a velocity difference which is caused by the difference between $V_3$ and $V_4$ is sufficiently smaller than the above-described error, therefore, V may be set so as to satisfy the relation $V=(V_3+V_4)/2$, or simply V may be set so as to satisfy the relation $V=V_3$ or $V_4$.

Subsequently, a current $I_{v5}(t)$ obtained when the retarding voltage is set equal to $V_5$ (where $V_5>V_4$) is measured by an oscilloscope 9, and $I_{v4}(t)-I_{v5}(t)$ is obtained. The abscissa of the obtained waveform is converted to the cluster size. In the same way, measurement is conducted on the range from $V_{ret}=0V$ to $V_a$.

Figure 7:
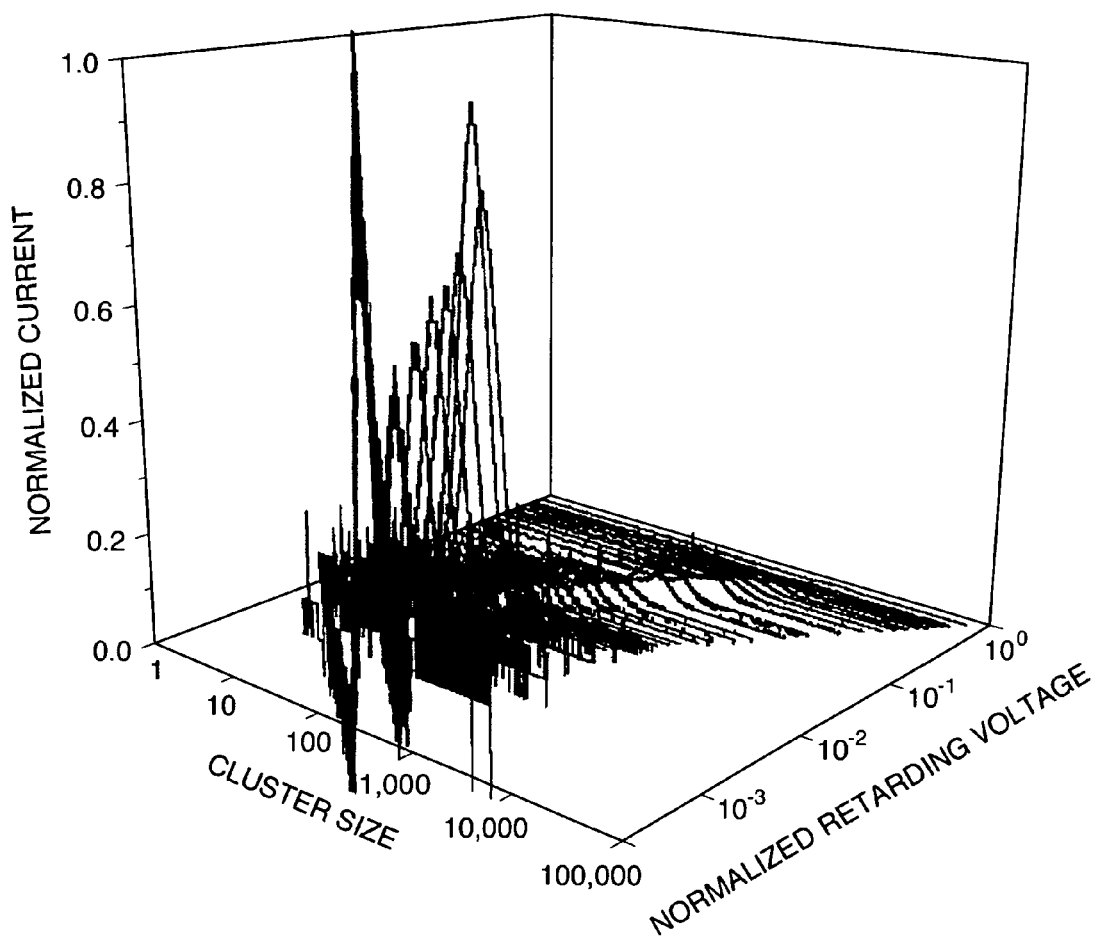
FIG. 7 is a schematic diagram showing size and energy distribution of a gas cluster ion beam.

Results are collectively displayed in a three-dimensional form in FIG. 7. As evident from FIG. 7, the relation between the energy distribution and the size distribution of cluster ions changing according to the applied retarding voltage can be grasped intuitively. It becomes possible to conduct irradiation with definite cluster size and energy distribution by conducting the present measurement and adjusting the generation condition of the ion beam.

Third Embodiment

Figure 8:
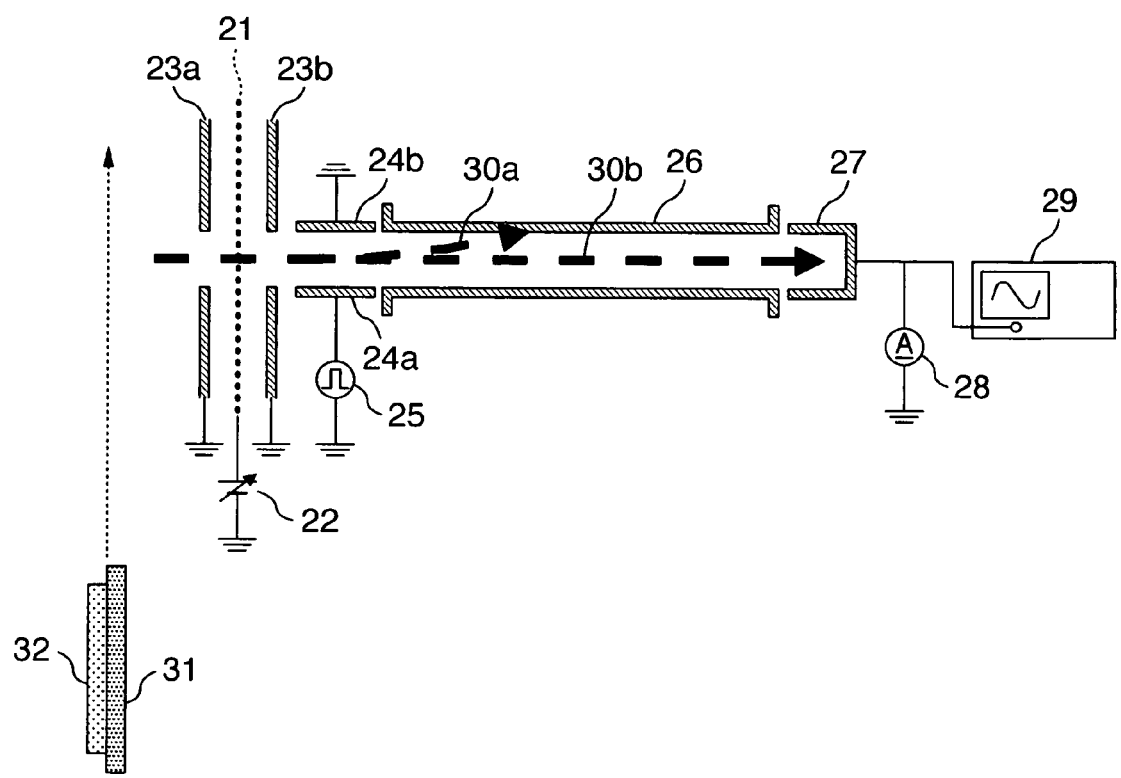
FIG. 8 is a schematic diagram of an irradiation apparatus including an apparatus for measuring size and energy distribution of a gas cluster ion beam.

FIG. 8 shows a third embodiment of the present invention. The apparatus according to the third embodiment is an apparatus for conducting smoothing milling on an ion beam irradiation region of a magnetic recording head by irradiating a magnetic recording head 32 by a gas cluster ion beam. The apparatus includes a cluster size measurement system. The cluster size measurement system includes a retarding grid 21 for applying a retarding voltage, ground electrodes 23a and 23b for suppressing an influence of an electric field that has oozed out from the retarding grid, deflection electrodes 24a and 24b for pulsating an ion beam, a drift tube 26, and a current measuring instrument. The magnetic recording head 32 is attached to a substrate holder 31.

In FIG. 8, a Faraday cup 27, a DC ammeter 28 for measuring a temporal average value of the current, and an oscilloscope 29 for measuring a change of the current with time are shown as an example of the current measuring instrument. However, other current measuring instruments are not excluded.

Neutral clusters generated in a generation chamber which is not illustrated are ionized in an ionization chamber, and then accelerated to definite energy $eV_a$. After acceleration, a beam transportation space ranging to the ground electrode 23a is typically kept in a non-electric field state.

Monomer ions and small-size gas cluster ions generated by collision of gas cluster ions with monomer ions or ambient gas molecules and resultant dissociation move at the same velocity as that of the original gas cluster ions. Therefore, energy of these ions becomes smaller than the original energy. If a retarding voltage $V_{ret}$ is applied to the retarding grid 21, therefore, low-energy monomer ions and small-size cluster ions included in gas cluster ion beam which is incident from the left cannot pass through the retarding grid 21.

A pulse voltage is applied to the deflection electrode 24a. When the deflection electrode 24a is at a high voltage, an ion beam which has passed through the retarding grid 21 cannot arrive at the Faraday cup 27 because the ion beam is deflected as represented by a trajectory 30a. When the voltage at the deflection electrode 24a is 0 V, however, the ion beam can pass through the drift tube 26 having a length L along a trajectory 30b and arrive at the Faraday cup 27.

As shown in FIG. 8, the cluster size measurement system is disposed so as to have the ground electrode 23a immediately behind the substrate holder 31. Or the cluster size measurement system is disposed so as to cause a section perpendicular to paper in an arbitrary position between the ground electrode 23a and the Faraday cup 27 to be coplanar with the substrate holder. If the cluster size measurement system and the substrate holder 31 interfere with each other during the beam irradiation or the cluster size measurement, the cluster size measurement system and the substrate holder 31 are adapted to be able to be evacuated from the beam line as occasion demands.

When applying a gas cluster ion beam milling apparatus having the gas cluster size measurement system shown in FIG. 8 to smoothing of an air bearing surface of the magnetic recording head, measurements (a) and (b) described hereafter are used suitably.

(a) First, with the deflection electrode 24a kept at the ground potential, a beam current received by the Faraday cup 27 is measured as a function of the retarding voltage by the DC ammeter 28. The gas cluster ions are accelerated to definite energy $eV_a$. If the retarding voltage is applied, however, the beam current abruptly decreases. Here, decreasing components are low-energy monomer ions and small-size gas cluster ions generated by collision with monomer ions and ambient gas molecules during the transportation of the gas cluster ion beam as described above.

If the retarding voltage is further raised, the decrease of the beam current becomes gentle and finally decreases abruptly near $V_a$. Here, on the basis of the retarding voltage-beam current characteristics thus obtained, a voltage applied to the retarding grid. 21 is set so as to fall in a region where the beam current gently decreases as the retarding voltage is raised.

By the present setting, it is possible to measure an effective cluster ion beam component having the milling capability which does not include low-energy monomer ions and small-size cluster ions. The retarding voltage is set as described above, and a pulse voltage is applied to the deflection electrode 24a. When the deflection electrode 24a is at the ground potential, a change of a current passed through between the deflection electrodes 24a and 24b and received by the Faraday cup 27 with time is observed by using the oscilloscope.

In addition, this result is applied to the equation $t=L(2 eV_a/m)$, and the abscissa is converted to mass m to obtain mass (cluster size) distribution. According to the present method, quantitative size distribution of gas cluster ions having milling capability can be obtained.

(b) A current $I_{v6}(t)$ arriving at the Faraday cup 27 when the retarding voltage is set to $V_6$ and a current $I_{v7}(t)$ arriving at the Faraday cup 27 when the retarding voltage is set to $V_7$ (where $V_7 > V_6$) are measured by an oscilloscope 29. A difference $I_{v6}(t) - I_{v7}(t)$ between the currents is obtained. In addition, by conducting conversion to the cluster size (mass) by using the conversion equation $t=L(2 eV/m)$, size distribution of gas cluster ions having energy between $eV_6$ and $eV_7$ can be obtained.

An error is caused because the time over which the deflection electrode 24a is at the ground potential is finite. If an error caused by a velocity difference which is caused by the difference between $V_6$ and $V_7$ is sufficiently smaller than the above-described error, therefore, V may be set so as to satisfy the relation $V=(V_6+V_7)/2$, or simply V may be set so as to satisfy the relation $V=V_6$ or $V_7$. Subsequently, a current $I_{v8}(t)$ obtained when the retarding voltage is set equal to $V_8$ (where $V_8 > V_7$) is measured by an oscilloscope 29, and $I_{v7}(t) - I_{v8}(t)$ is obtained. The abscissa of the obtained waveform is converted to the cluster size.

In the same way, measurement is conducted on the range from $V_{ret}=0V$ to $V_a$. According to the present method, the energy and size distribution of irradiation gas cluster ions can be obtained.

Before irradiating a magnetic recording head in the present apparatus with the cluster ion beam, the measurement (a) is conducted and the cluster size distribution having milling capability is observed. And it is determined whether the obtained distribution has a deviation from the distribution in the standard state of the apparatus. If there is a deviation, the gas cluster ion beam generation and transportation conditions are adjusted so as to cause the deviation to fall in a suitable range. After the deviation adjustment, a beam current obtained by the DC ammeter 28 when an appropriate retarding voltage is applied is used to determine the irradiation time.

Thereafter, the work 32 is irradiated by the gas cluster ion beam. If the work interferes with the cluster size measurement system at that time, the cluster size measurement system is evacuated. During the irradiation with the gas cluster ion beam, the irradiation is temporarily discontinued if necessary and the cluster generation and transportation conditions are adjusted. If the gas cluster ion beam current having the milling capability varies, the irradiation time is adjusted.

By measuring the gas cluster ion quantity having the milling capability and conducting irradiation while keeping the distribution definite, the sputtering yield can be stabilized. In addition, the milling damage can also be suppressed in a definite range.

Although the example in which the measurement (a) is conducted has been described, the measurement (b) may be conducted. Since the measurement (b) is longer in measurement time than the measurement (a), the cluster size, for example, at the time of apparatus shipping can be used for assurance or daily apparatus inspection. The cluster size can be stabilized and production at high yield becomes possible by conducting these measurements and adjusting the cluster generation and transportation conditions.

Heretofore, the smoothing milling of the air bearing surface of the magnetic recording head has been described. However, the present embodiment is not restricted to it. The present embodiment also brings about similar effects when the present embodiment is used in, for example, smoothing milling of a magnetic disk. Furthermore, when the gas cluster ion beam irradiation apparatus is used in ion implantation of semiconductors, stabilizing the cluster size leads to stabilizing the ion implantation depth. When conducting etching in the magnetic recording head or semiconductor manufacturing process, stabilizing the cluster size leads to stabilizing the sputtering yield, resulting in a yield improving effect.

Fourth Embodiment

Figure 9:
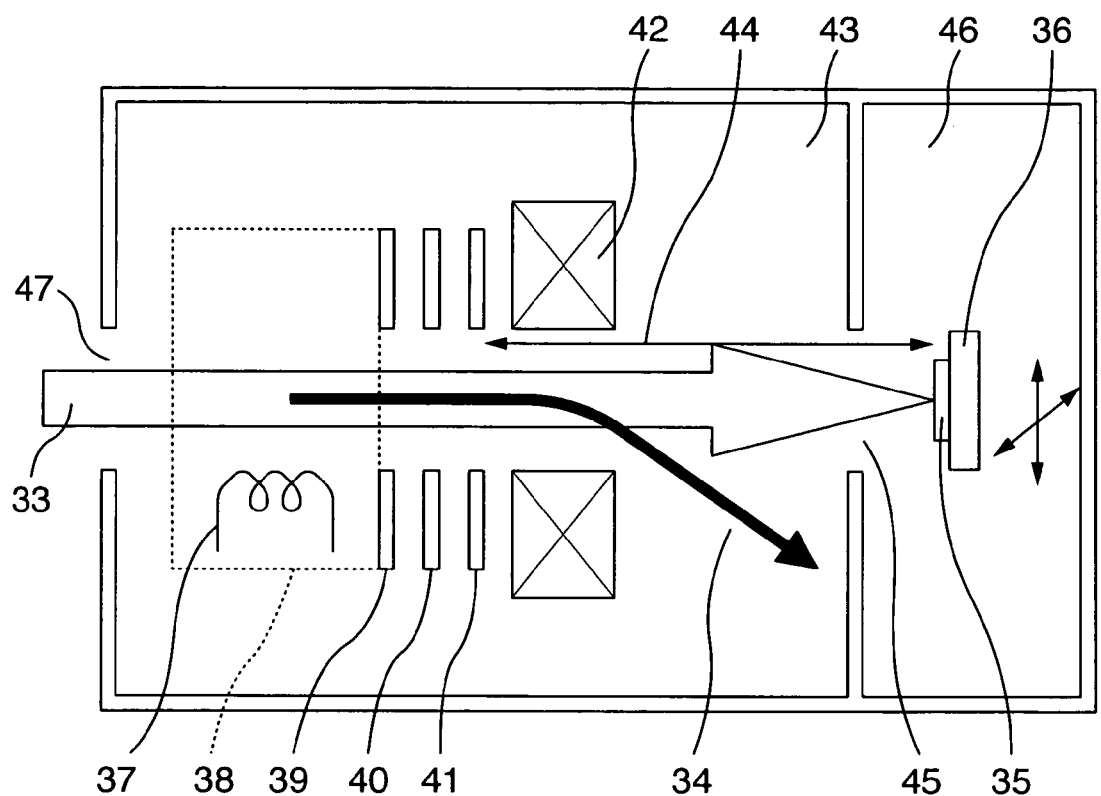
FIG. 9 is a schematic diagram showing an irradiation apparatus capable of keeping cluster size and energy distribution of a gas cluster ion beam in a state suitable for milling.

FIG. 9 shows a fourth embodiment of the present invention. A gas cluster ion beam irradiation apparatus according to the present embodiment includes a gas cluster inflow port 47 for introducing neutral clusters generated by a gas cluster generation chamber, an ion source 38 for ionizing the neutral clusters, an acceleration electrode system 39 and 40 and a ground electrode 41 for extracting gas cluster ions from the ion source and accelerating the cluster ions, an ionization and ion transportation chamber 43, and a pumping unit for exhausting the air from the ionization and ion transportation chamber. The pumping unit is not illustrated. The ionization and ion transportation chamber 43 includes a magnet 42 for generating a magnetic field in a direction perpendicular to a beam in order to remove monomer ions generated concurrently with gas cluster ions from the beam, and an orifice 45 for preventing the work from being irradiated by the removed monomer ion beam.

A work 35 fixed to a work holder 36 which is provided in an irradiation chamber 46 is irradiated by a gas cluster ion beam through the ionization and ion transportation chamber.

In the apparatus shown in FIG. 9, a current is let flow through a filament 37. Thermions generated from the filament are accelerated to several tens to several hundreds eV, caused to collide with neutral clusters let flow in from the gas cluster inflow port 47, and ionized. In addition, the ion source 38 is caused to have the same potential as that at the acceleration electrode 39. Positive ions can be extracted from the ion source 38 by applying a positive high voltage to the acceleration electrode 39 and applying a negative high voltage to the acceleration electrode 40.

The ionization method and the ion extraction method may be methods other than those described above. Furthermore, the polarity of extracted ions is not restricted to the positive polarity. It is desirable that the pressure in the irradiation chamber is kept at a value lower than that in the ionization and ion transportation chamber and the distance between the orifice 45 and the work 35 is made as short as possible.

In the gas cluster ion beam irradiation apparatus according to the present invention, control is exercised so as to satisfy the relation $P \times L \leq 30/N^{2/3}/E^{1/2}$ Pa.m, where P is a pressure (with unit Pa) in the ionization and ion transportation chamber kept by a pumping unit which is not illustrated, L is an ion transportation length 44 (with unit m) which means the distance between the ground electrode 41 and the work 35, N is the size, E is kinetic energy (eV) of gas cluster ions by which the work is irradiated.

For example, when conducting irradiation with Ar gas cluster ions having 2,000 as the center of size distribution, at 20 keV, it follows that $P \times L \leq 1.3 \times 10^{-3}$ Pa.m. By thus exercising control, a gas cluster ion beam irradiation apparatus that does not include low-energy monomer ions and small-size gas cluster ions lacking the milling capability can be obtained.

If $P \times L$ exceeds $30/N^{2/3}/E^{1/2}$ Pa.m, a gas cluster ion collides with residual gas molecules at least 20 times during the transportation. Collision with the residual gas molecules is equivalent to sputtering the gas cluster ion with residual gas molecules. Atoms included in the gas cluster ions are lost by this collision.

For example, it is now supposed that ten Ar atoms are lost every collision when conducting irradiation at 20 keV with an Ar gas cluster ion beam having 2000 as the center of size distribution at the time of gas cluster ion formation. If $P \times L$ exceeds $1.3 \times 10^{-3}$ Pa.m, the cluster size becomes smaller on the work surface by at least 10% and simultaneously the energy also falls by at least 10%. As a result, the sputtering yield falls. Even if the ion dose quantity is the same, therefore, the milling quantity falls and desired milling cannot be conducted.

In addition, the present invention provides a method for smoothing an air bearing surface of a magnetic recording head by using the gas cluster ion beam irradiation apparatus. In the gas cluster ion beam irradiation apparatus, control is exercised so as to satisfy the relation $P \times L \leq 30/N^{2/3}/E^{1/2}$ Pa.m, where P is a pressure (with unit Pa) in the ionization and ion transportation chamber kept by a pumping unit which is not illustrated, L is an ion transportation length 44 (with unit m) which means the distance between the ground electrode 41 and the work 35, N is the size, E is kinetic energy (eV) of gas cluster ions by which the work is irradiated. In this state, the work 35 (the air bearing surface of the magnetic recording head) is irradiated by a gas cluster ion beam and smoothed.

Before irradiation, a beam current is measured by using a beam current measuring instrument which is not illustrated. An ion dose quantity and an irradiation time that are sufficient for obtaining desired surface roughness are calculated, and irradiation is conducted. By exercising control so as to cause the product of P and L to fall in the range, it is possible to obtain a gas cluster ion beam that does not include low-energy monomer ions and small-size gas cluster ions lacking the milling capability.

The case where the beam irradiation time is calculated from the ion beam current measured before the air bearing surface of the magnetic recording head is irradiated has been described. However, it is also possible to provide a beam current measuring instrument on the work holder 36 as well and calculate the irradiation time from an ion dose accumulation value. By doing so, it is possible to prevent the milling quantity from deviating from a desired value. According to the present method, it is possible to keep the sputtering yield constant and suppress milling damage into a definite range. An air bearing surface of a magnetic recording head that is extremely smooth and little in milling damage can be obtained stably.

Heretofore, the smoothing milling of the air bearing surface of the magnetic recording head has been described. However, the present embodiment is not restricted to it. The present embodiment also brings about similar effects when the present embodiment is used in, for example, smoothing milling of a magnetic disk. Furthermore, when the gas cluster ion beam irradiation apparatus is used in ion implantation of semiconductors, stabilizing the cluster size leads to stabilizing the ion implantation depth. When the gas cluster ion beam irradiation apparatus is used for etching milling in the magnetic recording head or semiconductor manufacturing process, stabilizing the cluster size leads to stabilizing the sputtering yield, resulting in a yield improving effect.

Figure 10:
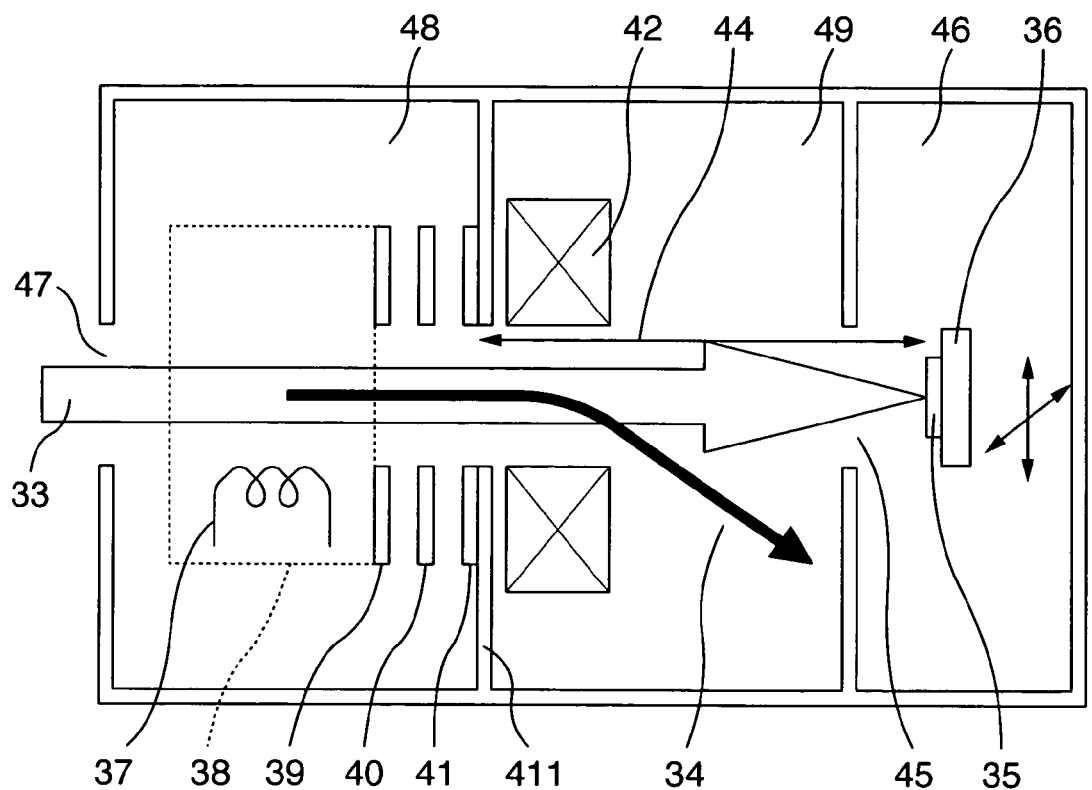
FIG. 10 is a schematic diagram showing an irradiation apparatus in which cluster size and energy distribution of a gas cluster ion beam is kept in a state suitable for milling by conducting differential pumping on an ion transportation chamber.

As methods for making P or L small in order to satisfy the condition $P \times L \leq 1.3 \times 10^{-3}$ Pa.m, methods for keeping P small, such as (a) a method for increasing the exhaust velocity of the pumping unit in the ionization and ion transportation chamber, and (b) a method for narrowing down an inflow quantity from the gas cluster inflow port by using an inflow quantity adjustment unit which is not illustrated, and methods for keeping L small, such as (c) a method for making the distance between the magnet and the orifice small by making the deflection angle of monomer ions large by use of a magnet that generates a strong magnetic field, and (d) a method for making the distance between the magnet and the orifice small by making the orifice diameter small, are conceivable. In addition, (e) a method for making P small by separating the ionization and ion transportation chamber 43 into an ionization chamber 48 and an ion transportation chamber 49 by use of a chamber partition 411 with the ground electrode 41 attached thereto and conducting differential pumping with respect to the ion transportation chamber as shown in FIG. 10 is also conceivable.

Figure 11:
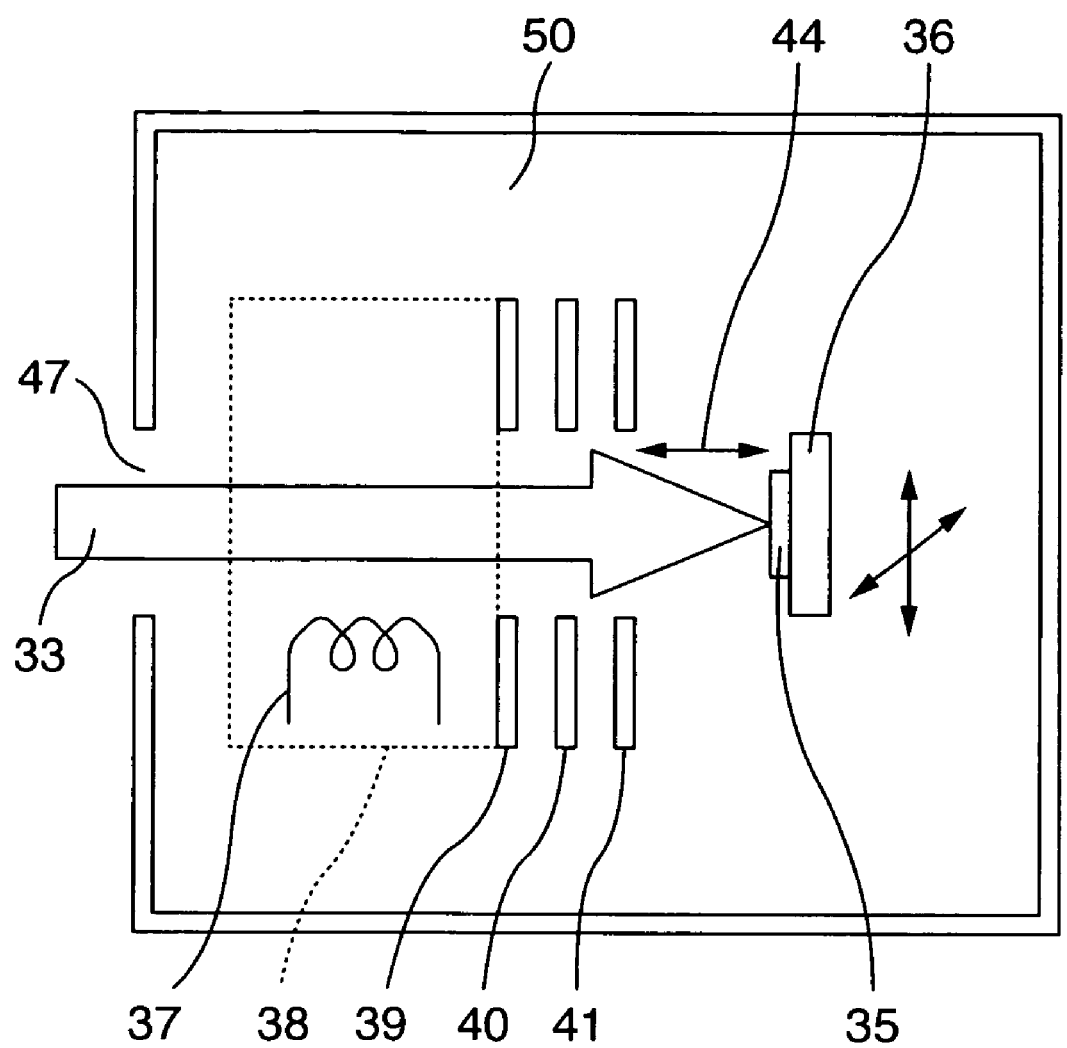
FIG. 11 is a schematic diagram showing an irradiation apparatus in which cluster size and energy distribution of a gas cluster ion beam is kept in a state suitable for milling, when the number of monomer ions included in a gas cluster ion beam is small so as not to exert a bad influence upon milling.

It is also possible to use the chamber partition 411 as the ground electrode. Furthermore, in the case where monomer ions included in the gas cluster ion beam by which the work is irradiated do not exert bad influence upon the milling result, the ion transportation length L (44) can be made short by (f) omitting the magnet and the orifice and integrating the ionization unit, the ion transportation device and the irradiation unit into a single chamber 50 as shown in FIG. 11.

The air bearing surface of the magnetic recording head is fixed to the work holder 36 in the gas cluster ion beam irradiation apparatus so as to be exposed to the gas cluster ion beam. Various conditions are controlled so as to satisfy the relation $P \times L \leq 30/N^{2/3}/E^{1/2}$ Pa.m, where P is a pressure (with unit Pa) in the ionization and ion transportation chamber kept by an exhaust unit which is not illustrated, L is an ion transportation length 44 (with unit m), N is the size, E is kinetic energy (eV) of gas cluster ions by which the work is irradiated.

For example, when conducting irradiation with Ar gas cluster ions having a size of 2,000, at 20 keV, it follows that $P \times L \leq 1.3 \times 10^{-3}$ Pa.m. Then, the beam current is measured by using a beam current measuring instrument which is not illustrated. An irradiation time is calculated so as to attain a desired irradiation quantity on the basis of the measured beam current value. Then, irradiation using a gas cluster ion beam is conducted. If a current measuring instrument is provided on the work holder at this time, the beam current value can be monitored in real time.

Although the present invention relates to a milling method for smoothing an air bearing surface of a magnetic recording head, and a gas cluster ion beam irradiation apparatus used for the milling, the present invention can also be applied to smoothing and ion beam etching in other magnetic recording head manufacturing processes and semiconductor manufacturing processes.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications a fall within the ambit of the appended claims.

The invention claimed is:

1. A gas cluster ion irradiation apparatus, comprising:
   a gas cluster generation unit which generates gas clusters of gaseous atoms or molecules aggregated in a cluster;
   an ionization unit which ionizes said gas clusters; and
   an ion transportation chamber which transports ionized gas cluster ions in a direction of a work disposed in an ion irradiation chamber;
   wherein a product of a pressure (Pa) in said gas cluster ion transportation chamber, in which gas cluster ions having energy E(eV) and an average size N are transported, and a gas cluster ion transportation length (m) is equal to or less than $30/N^{2/3}/E^{1/2}$.

2. The gas cluster ion irradiation apparatus according to claim 1, wherein said gas cluster ions are transported as a gas cluster ion beam, further comprising an ion beam current measuring unit disposed on a work holder for holding said work, said ion beam current measuring unit measuring a current of said gas cluster ion beam, and wherein using an ion beam current value obtained from said ion beam current measuring unit, a dosage and irradiation time duration of said gas cluster ions to be irradiated on said work are calculated.

3. A gas cluster ion irradiation apparatus comprising:
   a gas cluster generation unit which generates gas clusters of gaseous atoms or molecules aggregated in a cluster;
   an ionization unit which ionizes said gas clusters; and
   an ion transportation chamber which transports ionized gas cluster ions in a direction of a work disposed in an ion irradiation chamber;
   wherein a pressure (Pa) in said gas cluster ion transportation chamber, in which gas cluster ions having energy E (eV) and an average size N are transported, is controlled by using an air exhaust unit provided at said ion transportation chamber, so that a product of said pressure (Pa) in said gas cluster ion transportation chamber and a gas cluster ion transportation length (m) is equal to or less than $30/N^{2/3}/E^{1/2}$.

4. A gas cluster ion irradiation apparatus comprising:
   a gas cluster generation unit which generates gas clusters of gaseous atoms or molecules aggregated in a cluster;
   an ionization chamber disposed adjacent to said gas cluster generation unit, said ionization chamber including an ionization unit which ionizes said gas clusters; and
   an ion transportation chamber which transports ionized gas cluster ions in a direction of a work disposed in an ion irradiation chamber;
   wherein said ionization chamber and said ion transportation chamber are disposed via a chamber partition having an aperture which allows said gas cluster ions to pass therethrough; and
   wherein a pressure (Pa) in said ion transportation chamber, in which gas cluster ions having energy E (eV) and an average size N are transported, is controlled by using an air exhaust unit provided at said ion transportation chamber, so that a product of said pressure (Pa) in said ion transportion chamber and a gas cluster ion transportation length (m) is equal to or less than $30/N^{2/3}E^{1/2}$.

\* \* \* \* \*